US005587682A

United States Patent [19]

Colli et al.

[11] Patent Number: 5,587,682

[45] Date of Patent: Dec. 24, 1996

[54] FOUR-QUADRANT BICMOS ANALOG MULTIPLIER

[75] Inventors: Gianluca Colli, Sannazzaro De Burgondi; Massimo Franciotta, Pavia; Rinaldo Castello, Arcore, all of Italy

[73] Assignee: SGS-Thomson Microelectronics S.r.l., Brianza, Italy

[21] Appl. No.: 413,772

[22] Filed: Mar. 30, 1995

[51] Int. Cl.[6] .............................. G06G 7/16; H03K 5/22

[52] U.S. Cl. .......................... 327/357; 327/359; 327/113

[58] Field of Search .................................. 327/355, 356, 327/357, 358, 359, 105, 563, 113; 455/333

[56] References Cited

U.S. PATENT DOCUMENTS

| | | | |
|---|---|---|---|
| 4,156,283 | 5/1979 | Gilbert | 327/359 |
| 4,546,275 | 10/1985 | Penafinol et al. | 327/357 |
| 4,937,516 | 6/1990 | Sempel | 327/105 |
| 5,021,693 | 6/1991 | Shima | 327/357 |
| 5,107,150 | 4/1992 | Kimura | 327/359 |
| 5,151,625 | 9/1992 | Zarabadi et al. | 327/356 |
| 5,332,937 | 7/1994 | Castello et al. | 327/563 |

*Primary Examiner*—Timothy P. Callahan
*Assistant Examiner*—Eunja Shin
*Attorney, Agent, or Firm*—Vinson & Elkins, L.L.P.

[57] ABSTRACT

An analog multiplier circuit includes three transconductance stages. One of the transconductance stages, receiving a first differential voltage, conducts a differential current responsive to the first differential voltage from the other two transconductance stages. The differential current changes the transconductance in the other two transconductance stages, which are cross-coupled with one another. The second differential input voltage is presented to the other two transconductance stages in parallel, resulting in an output differential current or voltage based on the product of the first and second differential input voltages. Each of the transconductance stages is implemented in BiCMOS, and each includes two differential legs, each having a MOS transistor receiving an input signal and a cascode bipolar transistor. Each transconductance stage also includes a reference leg which develops the drain-source voltage for the MOS transistors; the first transconductance stage differentially varies this drain-source voltage in the other two stages to produce the product.

14 Claims, 2 Drawing Sheets

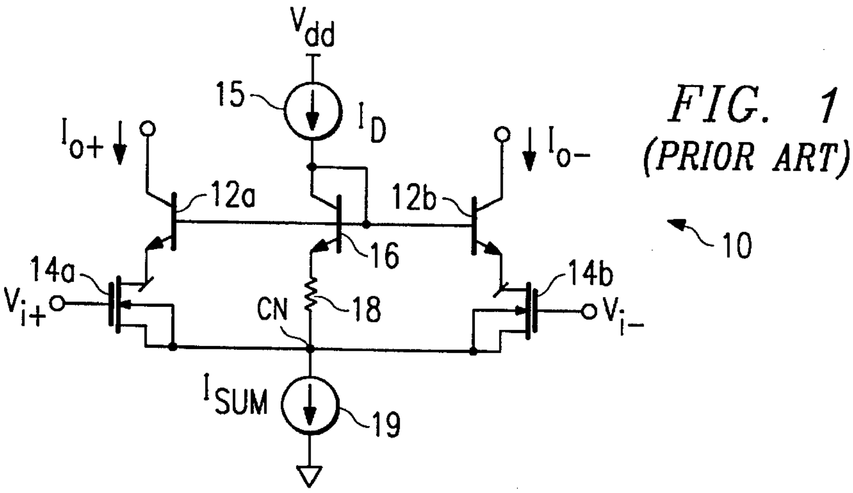
*FIG. 1*
*(PRIOR ART)*
*FIG. 2*
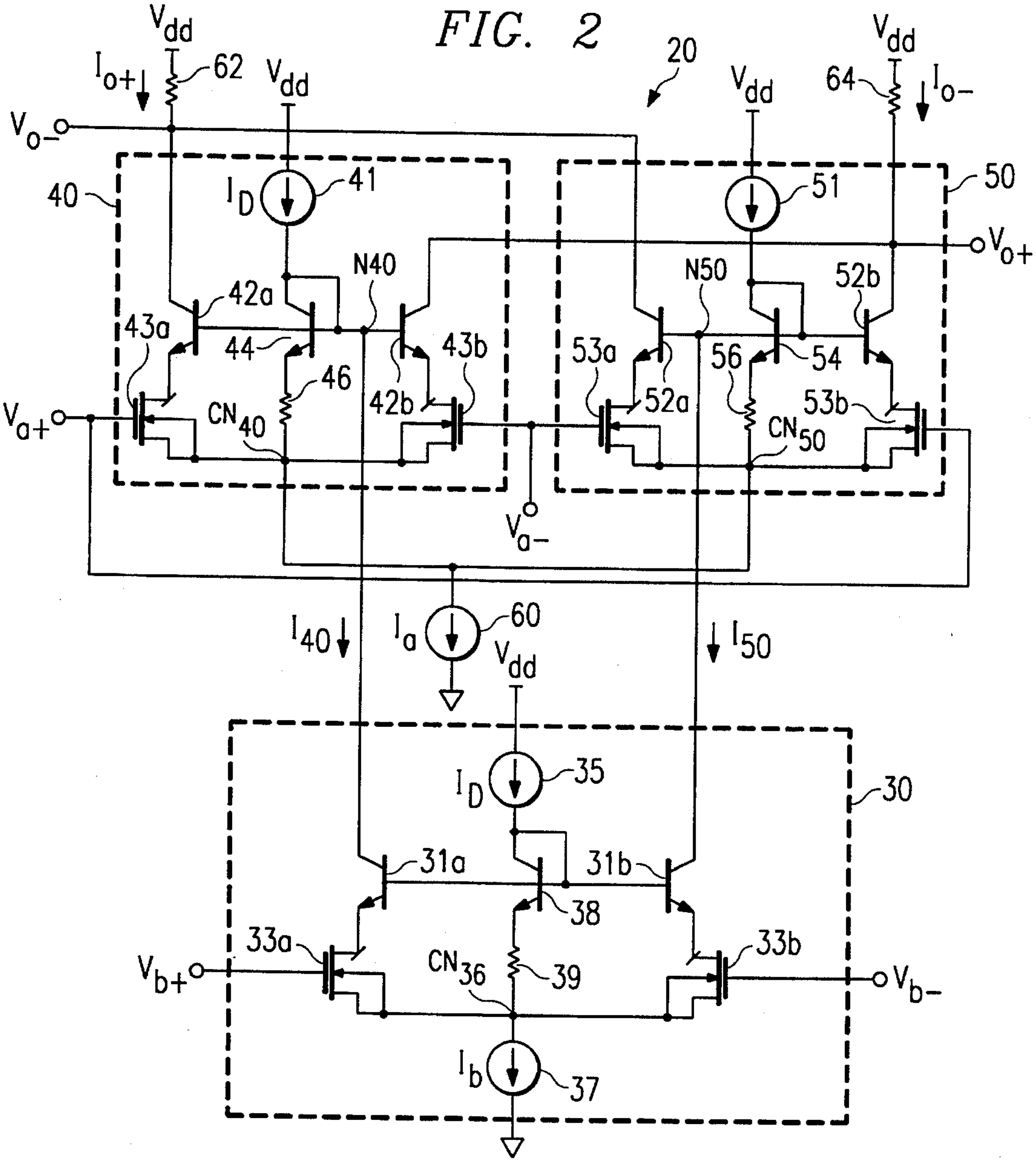

FOUR-QUADRANT BICMOS ANALOG MULTIPLIER

This invention is in the field of analog signal processing, and is more particularly directed to analog multiplier circuits.

BACKGROUND OF THE INVENTION

As is well known in the field of analog signal processing, four-quadrant analog multiplier circuits are fundamental building blocks for many circuit applications. These circuit applications include phase detectors in phase-locked loops (PLLs), frequency translators, AM modulator circuits, RF mixer circuits, and receiver circuitry of the heterodyne, super heterodyne, and homodyne type. These circuits are particularly useful in applications such as audio and video signal processing, transmission and receipt of analog signals, and adaptive filters such as correlators and convolution circuits.

As is also known in the art, the term "four-quadrant" multiplier refers to a circuit for multiplying two signed analog signals. Conventional four-quadrant multiplier circuits include those circuits which depend upon variations in transconductance in differential stages, and those circuits which are hardware implementations of a quadratic algebraic function (and rely upon the quadratic characteristics of MOS transistors).

The most widely-used analog multiplier circuit is commonly referred to as the "Gilbert Cell", described in Gilbert "A precise Four-Quadrant Multiplier with Subnanosecond Response", *J. Sol. State Circ.*, Vol. SC-3 (IEEE, December 1968), pp. 365–373; Gilbert, "A Four-Quadrant Analog Divider/Multiplier with 0.01% Distortion", *Digest of Technical Papers:* 1983 *Int'l Sol. State Circ. Conf.* (IEEE, 1983), pp. 248–249; and in Gray and Meyer, *Analysis and Design of Analog Integrated Circuits,* (John Wiley & Sons, 1977), pp. 563–570. The Gilbert Cell, which is realized using bipolar transistors, relies upon variations in transconductance of three differential stages to perform the multiplication. While the Gilbert Cell generally provides high frequency performance, the input dynamic range is limited by the bipolar realization. Furthermore, the active power dissipation of the bipolar Gilbert Cell circuit is quite high, being on the order of 50 mW or greater, depending upon the frequency band, upon the dynamic input signal range, and upon whether prestage circuitry is provided. In addition, the power supply voltage required for conventional bipolar Gilbert Cell realizations is also quite high, generally being on the order of 5 volts when implemented with modern technology.

MOS and complementary-MOS (CMOS) realizations of Gilbert Cell multipliers are also known in the art. MOS technology offers the benefit of reduced power dissipation and reduced manufacturing cost. Examples of such implementations may be found in Babanezhad, et al., "A 20 V Four-Quadrant CMOS Analog Multiplier", *J. Sol. State Circ.*, Vol. SC-20, No. 6 (IEEE, 1985); Wang, "A CMOS Four-Quadrant Analog Multiplier with Single-Ended Voltage Output and Improved Temperature Performances", *J. Sol. State Circ.*, Vol. SC-26, No. 9 (IEEE, 1991); Qin, et al., "A ±5 V CMOS Analog Multiplier", *J. Sol. State Circ.*, Vol. SC-22, No. 6 (IEEE, 1987); and Wong, et al., "Wide Dynamic Range Four-Quadrant CMOS Analog Multiplier Using Linearized Transconductance Stages", *J. Sol. State Circ.*, Vol. SC-21, No. 6 (IEEE, 1986). It is believed, however, that conventional MOS or CMOS Gilbert Cell multipliers tend to exhibit poor linearity for a given supply voltage, and as such are not well-suited for the important low voltage applications now increasing in popularity, particularly in the telecommunications and portable computing system fields.

Analog multipliers that rely upon the square-law MOS transistor characteristics have been reported to have improved linearity over the Gilbert Cell multipliers discussed above. Attention is directed to "An MOS Four-Quadrant Analog Multiplier Using Simple Two-Input Squaring Circuits with Source Followers", *J. Sol. State Circ.*, Vol. SC-25, No. 3 (IEEE, 1990); Pena-Finol, et al., "A MOS Four-Quadrant Analog Multiplier Using the Quarter-Square Technique", *J. Sol. State Circ.*, Vol. SC-22, No. 6 (IEEE, 1987); and Kim, et al., "Four-Quadrant CMOS Analogue Multiplier", *Electronic Letters,* Vol. 22, No. 7 (March 1992). As is known in the art, analog multipliers of these types tend to be quite complex, requiring a large number of transistors. For example, the Kim et al. paper describes a multiplier which uses two buffers in a feedback arrangement, with two differential stages and a current mirror. This complexity also tends to limit the bandwidth of these circuits.

By way of further background, U.S. Pat. No. 5,332,937 issued Jul. 26, 1994, assigned to SGS-Thomson Microelectronics, S.r.l., and incorporated herein by this reference, describes a BiCMOS transconductance stage as used in high-frequency continuous-time filters. In this transconductor, cascode-connected bipolar transistors maintain a relatively constant drain-to-source voltage for MOS transistors that receive a differential input at their gates. These MOS transistors remain biased in the triode, or linear, region. This arrangement allows generation of an output differential current that is quite linear to the differential input voltage, and with excellent high frequency performance.

Referring to FIG. 1, transconductance stage 10 constructed according to the above-incorporated U.S. Pat. No. 5,332,937, will be described in detail. Transconductance stage 10 includes two differential legs that conduct currents $I_{0+}$ and $I_{0-}$, respectively, and a reference leg that conducts current $I_D$. One differential leg includes bipolar transistor 12*a* and MOS transistor 14*a*, connected in series (i.e., with the drain of transistor 14*a* connected to the emitter of transistor 12*a*); the gate of MOS transistor 14*a* receives input voltage $V_{i+}$. Similarly, the second differential leg includes bipolar transistor 12*b* and MOS transistor 14*b* connected in series, with the gate of MOS transistor 14*b* receiving input voltage $V_{i-}$. The sources of MOS transistors 14*a*, 14*b* (and their body nodes) are connected together at common node CN.

The reference leg of transconductance stage 10 includes current source 15, which conducts current $I_D$ from power supply voltage $V_{dd}$. Bipolar transistor 16 has its collector and base connected to current source 15, and connected to the bases of transistors 12*a*, 12*b* in the differential legs. The emitter of bipolar transistor 16 is connected to resistor 18, which is connected on its other side to common node CN. Current source 19 conducts current $I_{SUM}$ (i.e., the sum of currents $I_D$, $I_{0+}$, $I_{0-}$) between common node CN and ground.

In transconductance stage 10, each of MOS transistors 14*a*, 14*b* os to be biased in its triode region (i.e., $V_{ds}<V_{gs}-V_{th}$, where $V_{th}$ is the MOS threshold voltage of transistors 14*a*, 14*b*), so that its drain-source current ($I_{ds}$) is linearly proportional to its gate-source voltage ($V_{gs}$), so long as its drain-source voltage ($V_{ds}$) remains constant. The current $I_D$ conducted by resistor 18 establishes the drain-source voltages for transistors 14a, 14b. Bipolar transistors 12a, 12b, (biased by transistor 16) minimize variations in the potential at the drains of transistors 14a, 14b, since their base-emitter voltages are substantially constant over variations in their collector current ($I_{0+}$, $I_{0-}$, respectively). Accordingly, one may calculate the differential output current $\Delta I_0$ (the difference between $I_{0+}$ and $I_{0-}$) as follows:

$$\Delta I_0 = k_N\left(V_{i+} - V_s - V_{th} - \frac{V_{ds}}{2}\right)V_{ds} - k_N\left(-V_{i-} - V_s - V_{th} - \frac{V_{ds}}{2}\right)V_{ds}$$

or, since $k_N = \mu C_{ox}(W/L)$, $$\Delta I_0 = \mu C_{ox}\frac{W}{L}V_{ds}(V_{i+} - V_{i-})$$

where $\mu$ is the mobility, $C_{ox}$ is the gate oxide capacitance, and W/L is the channel width-to-length ratio of transistors 14, assuming matched construction. Accordingly, the differential current $\Delta I_0$ is a linear function of the differential input voltage $V_{i+} - V_{i-}$.

As described in the above-incorporated U.S. Pat. No. 5,332,937, a transconductance stage such as transconductance stage 10 of FIG. 1 has been utilized in a continuous-time filter, and has been observed to provide highly linear behavior and good frequency performance.

It is an object of the present invention to provide a high frequency analog multiplier that has a large input dynamic range.

It is a further object of the present invention to provide such a multiplier circuit which is operable at low power supply voltages, as useful in low power telecommunication and portable computing applications.

It is a further object of the present invention to provide such a multiplier circuit which has relatively low power dissipation for its frequency performance, as useful in low power telecommunication and portable computing applications.

It is a further object of the present invention to provide such a multiplier circuit that has very low total harmonic distortion.

It is a further object of the present invention to provide such a multiplier circuit that may be implemented with a small number of transistors.

Other objects and advantages of the present invention will be apparent to those of ordinary skill in the art having reference to the following specification together with the drawings.

SUMMARY OF THE INVENTION

The invention may be implemented into an analog multiplier circuit utilizing three transconductance stages. Each transconductance stage includes two differential legs, each having a MOS transistor and a bipolar transistor connected in series; the gate of the MOS transistor in the differential leg receives one end of the differential input voltage. Each transconductance stage also includes a reference stage having a bipolar transistor and a resistor, connected in series with one another. The base of the bipolar transistor is connected to its collector and to the bases of the bipolar transistors in the differential legs. This arrangement biases the MOS transistors in the triode, or linear, region, with the resistor setting the drain-to-source voltage of the MOS transistors. In each stage, a differential current is thus produced responsive to the differential voltage applied to the MOS transistor gates.

The multiplier is constructed by cross-coupling the outputs of two transconductance stages that receive, in parallel, one of the differential voltage inputs. The reference legs of the cross-coupled stages are biased by the output legs of the third transconductance stage, which receives the second differential voltage at its inputs. In this way, the transconductance of the cross-coupled stages varies with the second differential input, such that the differential current produced by the output legs of the cross-coupled stages is the product of the two input differential voltages.

BRIEF DESCRIPTION OF THE DRAWINGS

FIG. 1 is an electrical diagram, in schematic form, of a conventional transconductance stage as utilized in the analog multiplier according to the preferred embodiment of the invention.

FIG. 2 is an electrical diagram, in schematic form, of an analog multiplier according to the preferred embodiment of the invention.

DETAILED DESCRIPTION OF THE PREFERRED EMBODIMENT

Figure 3:
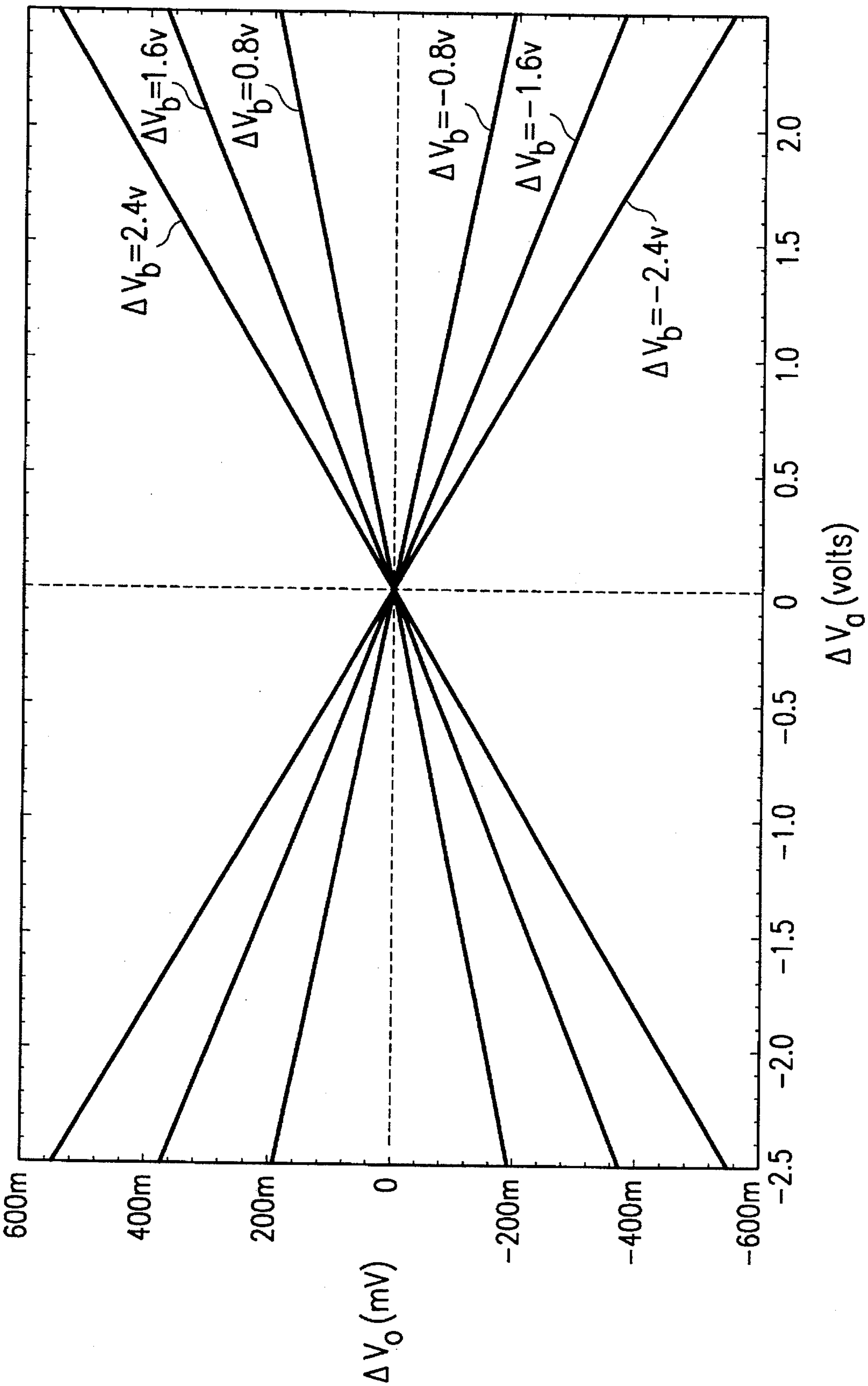
FIG. 3 is a plot of output differential voltage as a function of one of the input differential voltages, plotted for various values of a second input differential voltage.

Referring now to FIG. 2, analog multiplier 20 according to the preferred embodiment of the invention will now be described in detail. According to this embodiment of the invention, analog multiplier 20 is realized from three transconductance stages 30, 40, 50, each constructed similarly to transconductance stage 10 described hereinabove.

As shown in FIG. 2, transconductance stage 30 includes three legs, two of which operate differentially to establish an output differential current, and the other of which is a reference leg which provides stable linear, or triode region, bias for the differential legs. Accordingly, transconductance stage 30 includes current source 35 which conducts a current $I_D$ from the $V_{dd}$ power supply into the collector and base of bipolar transistor 38. The emitter of transistor 38 is connected to resistor 39, which is connected on its other end, at common node $CN_{36}$, to current source 37. Current source 37 conducts a current $I_b$ from common node $CN_{36}$ to ground. Current sources 35, 37, as well as other current sources in multiplier 20, may be realized by way of MOS transistors with gates biased by a stable reference voltage generated on-chip, as is well known in the art, or by other conventional current source circuit techniques.

The differential legs of transconductance stage 30 are implemented by way of series-connected bipolar and MOS transistors, as described hereinabove relative to transconductance stage 10. Bipolar transistors 31a and 31b have their bases connected to the common base and collector of transistor 38. The emitter of transistor 31a is connected to the drain of MOS transistor 33a, and the emitter of transistor 31b is connected to the drain of MOS transistor 33b. The sources (and body nodes) of MOS transistors 33a, 33b are connected together at common node $CN_{36}$, so that the current $I_b$ conducted by current source 37 is the sum of current $I_D$ with the currents conducted by MOS transistors 33a, 33b. The gates of MOS transistors 33a, 33b receive the input voltages $V_{b+}$, $V_{b-}$, respectively. The collector of transistor 31a conducts a current $I_{40}$ produced by transconductance stage 40; likewise, the collector of transistor 31b conducts current $I_{50}$ from transconductance stage 50.

In operation, transconductance stage 30 operates similarly as transconductance stage 10 discussed hereinabove. Transistors 33a, 33b are biased in the triode region, as before, so that the current conducted thereby varies linearly with the voltage applied to their respective gates. The drain-source voltages of transistors 33a, 33b are maintained at a stable value, defined by the voltage across resistor 39, which depends upon the current $I_D$ therethrough (and, of course, the resistance of resistor 39). Also as described hereinabove, the cascode arrangement of bipolar transistors 31a, 31b maintain the drain-source voltages of transistors 33a, 33b relatively constant, rather than varying with variations in the drain-source current therethrough. Accordingly, the currents $I_{40}$, $I_{50}$ differ from one another in a way that depends upon the differential voltage between input voltages $V_+$, $V_{b-}$. As will become apparent from the description hereinbelow, the variations in currents $I_{40}$, $I_{50}$ will modulate the transconductance of transconductance stages 40, 50, resulting in the desired multiplicative effect.

Each of transconductance stages 40, 50 are similarly constructed as transconductance stage 30, and thus has differential legs and a reference leg. With reference to transconductance stage 40, by way of example, a current source 41 conducts current $I_D$ into the collector and base of bipolar transistor 44 at node N40; the emitter of transistor 44 is connected to resistor 46, which in turn is connected to common node $CN_{40}$. In the differential legs, bipolar transistor 42a, having its gate connected to the gate and collector of transistor 44 at node N40, has its emitter connected to the drain of MOS transistor 43a. MOS transistor 43a has its source and body node connected to common node $CN_{40}$. Similarly, bipolar transistor 42b has its base connected to node N40, and has its emitter connected to the drain of MOS transistor 43b, which has its source and body node connected to common node $CN_{40}$.

The gates of MOS transistors 43a, 43b receive an input differential voltage on lines $V_{a+}$, $V_{a-}$, respectively. Common node $CN_{40}$ is connected to current source 60, which conducts a current $I_a$ to ground. The collector of bipolar transistor 42a is connected to resistor 62, which in turn is biased to $V_{dd}$; similarly, the collector of bipolar transistor 42b is connected to resistor 64, which in turn is biased to $V_{dd}$.

Transconductance stage 50 is constructed in similar fashion as transconductance stage 40 described hereinabove. Current source 51 conducts current $I_D$ into the collector and base of bipolar transistor 54 at node N50; the emitter of transistor 54 is connected to resistor 56, which in turn is connected to common node $CN_{50}$. A first differential leg includes bipolar transistor 52a with its gate connected to the gate and collector of transistor 54 at node N50, and with its emitter connected to the drain of MOS transistor 53a. Similarly, bipolar transistor 52b has its base connected to node N50, and has its emitter connected to the drain of MOS transistor 53b. MOS transistors 53a and 53b each have their source and body node connected to common node $CN_{50}$, which is connected to current source 60 (and which is therefore common with common node $CN_{40}$ of transconductance stage 40).

Transconductance stage 50 is connected to transconductance stage 40 in a cross-coupled fashion. As such, the gates of MOS transistors 53a, 53b are connected to lines $V_{a-}$, $V_{a+}$, respectively, opposite from the input connection of transconductance stage 40. The collector of bipolar transistor 52a is connected to the collector of bipolar transistor 42a at resistor 62, and the collector of bipolar transistor 52b is connected to the collector of transistor 42b at resistor 64.

It should be noted at this time that the bias of the MOS transistors 33, 43, 53 in the triode region results in linear variations in the output currents $I_{40}$, $I_{50}$, $I_{0+}$ and $I_{0-}$ over a relatively wide dynamic range of input voltages. This linear operation will continue so long as the drain-source voltages of MOS transistors 33, 43, 53 do not exceed the gate-source voltage less the threshold voltage. Furthermore, the relatively low drain-source voltages for transistors 33, 43, 53 enable relatively low voltage operation for analog multiplier 20. Accordingly, analog multiplier 20 according to this preferred embodiment of the invention is particularly well-suited for use in integrated circuits intended for low voltage applications, such as telecommunications equipment, battery-powered portable notebook or laptop computers, and the like.

In operation, transconductance stage 30 operates similarly as transconductance stage 10 described hereinabove, except that its output currents correspond to currents $I_{40}$, $I_{50}$ conducted from nodes N40, N50, respectively. Accordingly, the behavior of these currents are as follows:

$$I_{40}-I_{50}=k_N\left(V_{b+}-V_s-V_{th}-\frac{V_{ds}}{2}\right)V_{ds}-k_N\left(-V_{b-}-V_s-V_{th}-\frac{V_{ds}}{2}\right)V_{ds}$$

or $$I_{40}-I_{50}=\mu C_{ox}\frac{W}{L}V_{ds}(V_{b+}-V_{b-})=G_{M30}\Delta V_b$$

where $G_{M30}$ is the transconductance of transconductance stage 30, and where $\Delta V_b$ is the differential input voltage applied to the gates of transistors 33a, 33b.

The differential $I_{40}$–$I_{50}$, generated responsive to the differential input voltage $\Delta V_b$, modulates the transconductance of transconductance stages 40, 50 relative to one another. This modulation in the transconductance of stages 40, 50 results from the change in the voltage drop across resistors 46, 56, respectively, resulting from variations in currents $I_{40}$, $I_{50}$, respectively, as set by transconductance stage 30. As is evident from FIG. 3, for example in transconductance stage 40, the current $I_D$ from current source 41 fixes the sum of the current through resistor 46, the base currents into transistors 42a, 42b, and the current $I_{40}$ to transconductance stage 30. As such, the current through resistor 46, and thus the drain-source voltage of transistors 43a, 43b, will decrease with increases in current $I_{40}$, and will increase with decreases in current $I_{40}$. Transconductance stage 50 operates in a similar fashion, such that the drain-source voltage of transistors 53a, 53b varies inversely relative to the current $I_{50}$.

Accordingly, one may consider the following relationships for the transconductances $g_{M40}$, $g_{M50}$ of transconductance stages 40, 50, respectively, relative to variations $\Delta I_{40}$, $\Delta I_{50}$, respectively:

$$g_{M40}=G_{M40}-\Delta I_{40}k_{43}R_{46}$$

and $$g_{M50}=G_{M50}-\Delta I_{50}k_{53}R_{56}$$

where $G_{M40}$ and $G_{M50}$ are the transconductances of stages 40, 50 for balanced values of currents $I_{40}$, $I_{50}$; where $k_{43}$, $k_{53}$ are the gain constants of MOS transistors, 43, 53, respectively; and where $R_{46}$, $R_{56}$ are the resistances of resistors 46, 56, respectively.

Transconductance stages 40, 50, as in the case of stage 30, also generate differential output currents responsive to differential input voltage applied to the gates of their respective MOS transistors 43, 53, respectively. The magnitude of these differential output currents depend upon the transconductance values $g_{M40}$, $g_{M50}$ which, as noted above, depend upon the differential voltage applied to the gates of MOS transistors 33*a*, 33*b* in transconductance stage 30. Also, as noted above, transconductance stages 40, 50 are cross-coupled at the output nodes of resistors 62, 64, such that their output currents are summed thereat. Accordingly, current $I_{0+}$ conducted by resistor 62 may be determined as follows:

$$I_{0=}=g_{M40}V_{a+}+g_{M50}V_{a-}$$

and current $I_{0-}$ conducted by resistor 64 may be determined as follows:

$$I_{0-}=g_{M40}V_{a-}+g_{M50}V_{a+}$$

It is preferable, for balanced operation, that device parameters in transconductance stages 40 and 50 match one another. Specifically, it is preferred that the device constants $k_{43}$, $k_{53}$ match one another (with value $k_n$), and that the resistance values $R_{46}$, $R_{56}$ match one another (with value R). The difference current $\Delta I_0$ (i.e., $I_{0+}-I_{0-}$) can then readily be calculated as follows, using $\Delta V_a=V_{a+}-V_{a-}$:

$$\Delta I_0=2\Delta V_a(g_{M40}-g_{M50})=2k_nRg_{M30}\Delta V_a\Delta V_b$$

However, since $G_{M40}=G_{M50}$ in the case where the device parameters in transconductance stages 40, 50 match one another, then:

$$g_{M40}-g_{M50}=k_nR(-\Delta I_{40}+\Delta I_{50})=-k_nRG_{M30}\Delta V_b$$

Therefore, one may calculate $\Delta I_0$ as follows:

$$\Delta I_0=-2k_nRG_{M30}\Delta V_a\Delta V_b$$

Assuming the resistances of resistors 62, 64 to be equal to one another (with value $R_0$), one may then determine a differential voltage output $\Delta V_0$ as follows:

$$\Delta V_0=V_{0+}-V_{0-}=-\Delta I_0R_0=2k_nRR_0G_{M30}\Delta V_a\Delta V_b$$

It is therefore evident that analog multiplier 20 produces a differential output voltage $\Delta V_0$ that is proportional to the product of the two input differential voltages $\Delta V_a$, $\Delta V_b$. This analysis remains valid so long as MOS transistors 33, 43, 53 are biased in the triode region, and so long as bipolar transistors 31, 38, 42, 44, 52, 54 are all biased in their active region.

It has been observed that analog multiplier 20 according to this embodiment of the invention provides a high degree of linearity in the output differential voltage. This linearity is due to the cancelling out of second order terms in the output currents of transconductance stages 40, 50, given the cross-coupled summing of their output currents. FIG. 3 illustrates a SPICE simulation of the operation of analog multiplier 20 according to this embodiment of the invention.

FIG. 3 illustrates the output differential voltage $\Delta V_0$ as a function of input differential voltage $\Delta V_a$ for different values of input differential voltage $\Delta V_b$. As is evident from FIG. 3, the differential input voltages can safely vary up to ±2.4 volts for a nominal $V_{dd}$ bias of 5 volts, thus providing an input dynamic range of approximately 48% (of the power supply voltage), while providing a differential output voltage swing of approximately 1 volt. This heightened input dynamic range results from the use of MOS transistors biased in the triode region, and since the circuit may be realized with only two transistors stacked in a leg of the transconductance stages; prior bipolar Gilbert cells have only a limited input dynamic range, which may be exceeded only with dramatic increases in the power dissipation.

Furthermore, the biasing of the MOS transistors in the triode region enables relatively low power supply voltages to be used, providing a corresponding decrease in the power dissipation. For example, power supply voltages below 3 volts (perhaps as low as 1.5 volts) may be used with the present invention, making this analog multiplier attractive for many modern low power applications such as telecommunications equipment and battery-powered portable computers. With a 3 volt power supply voltage, power dissipation of the analog multiplier according to the preferred embodiment of the invention has been simulated to be as low as 4 mW.

Simulation has also indicated that extremely high bandwidth performance may be obtained from the analog multiplier circuit according to the present invention. With a 5 volt power supply voltage, and referring to FIG. 2, linear operation has been simulated for frequencies of up to 1.2 GHz for the $V_a$ differential input, and up to 600 MHz for the $V_b$ differential input; bandwidth of up to 500 MHz has been simulated for this circuit when biased by a 3 volt power supply. Furthermore, total harmonic distortion (THD) of less than 1% when operating at the dynamic input limits is expected. Finally, it should be evident to those of ordinary skill in the art that the implementation of the analog multiplier circuit according to the present invention is quite simple, and may be realized in relatively small integrated circuit area.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An analog multiplier circuit, comprising:

a first transconductance stage, comprising:

first and second differential legs, each comprising a bipolar transistor and a MOS transistor connected in series, wherein the MOS transistor in the first differential leg has a source connected to a first common node and a gate for receiving a first input voltage and wherein the MOS transistor in the second differential leg has a source connected to the first common node and a gate for receiving a second input voltage;

a first reference leg, for biasing the bipolar transistors in the first and second differential legs into an active state, so that the MOS transistors in the first and second differential legs are biased into the triode region;

a second transconductance stage, cross-coupled with the first transconductance stage, and comprising:

third and fourth differential legs, each comprising a bipolar transistor and a MOS transistor connected in series, wherein the MOS transistor of the third differential leg has a source connected to a second common node and a gate for receiving the second input voltage and wherein the MOS transistor of the fourth differential leg has a source connected to the second common node and a gate for receiving the first input voltage; and a second reference leg, for biasing the bipolar transistors in the third and fourth differential legs into an active state, so that the MOS transistors in the third and fourth differential legs are biased into the triode region;

a first sum current source, connected between the first and second common nodes of the first and second transconductance stages and a reference voltage; and a third transconductance stage, comprising:

fifth and sixth differential legs, each comprising a bipolar transistor and a MOS transistor connected in series, wherein the MOS transistor in the fifth differential leg has a source connected to a third common node and a gate for receiving a third input voltage and wherein the MOS transistor in the sixth differential leg has a source connected to the third common node and a gate for receiving a fourth input voltage;

a third reference leg for biasing the bipolar transistors of the fifth and sixth differential legs into an active state, so that the MOS transistors in the fifth and sixth differential legs are biased in the triode region; and a second sum current source, connected between the third common node of the third transconductance stage and the reference voltage;

wherein the bipolar transistor in the fifth differential leg has a collector connected to the reference leg of the first transconductance stage;

and wherein the bipolar transistor in the sixth differential leg of the third transconductance stage has a collector connected to the reference leg of the second transconductance stage.

2. The analog multiplier of claim 1, further comprising:

a first output resistor, connected between a power supply voltage and collectors of the bipolar transistor in the first differential leg and of the bipolar transistor in the third differential leg; and a second output resistor, connected between a power supply voltage and collectors of the bipolar transistor in the second differential leg and of the bipolar transistor in the third differential leg.

3. The analog multiplier of claim 2, wherein the gate of the MOS transistor in the first differential leg is directly connected to the gate of the MOS transistor in the fourth differential leg;

and wherein the gate of the MOS transistor in the second differential leg is directly connected to the gate of the MOS transistor in the third differential leg.

4. The analog multiplier of claim 1, wherein the first reference leg comprises:

a first current source biased by a power supply voltage;

a bipolar transistor having a collector and base connected to the first current source and connected to bases of the bipolar transistors in the first and second differential legs, and having an emitter; and a resistor connected between the emitter of the bipolar transistor and the first common node.

5. The analog multiplier of claim 4, wherein the second reference leg comprises:

a second current source biased by the power supply voltage;

a bipolar transistor having a collector and base connected to the second current source and connected to bases of the bipolar transistors in the third and fourth differential legs, and having an emitter; and a resistor connected between the emitter of the bipolar transistor and the second common node.

6. The analog multiplier of claim 5, wherein the third reference leg comprises:

a third current source biased by the power supply voltage;

a bipolar transistor having a collector and base connected to the third current source and connected to bases of the bipolar transistors in the fifth and sixth differential legs, and having an emitter; and a resistor connected between the emitter of the bipolar transistor and the third common node of the third transconductance stage.

7. A method of multiplying the magnitude of first and second input differential voltages, comprising the steps of:

biasing first and second MOS transistors in a first transconductance stage in the triode region, said first and second MOS transistors having sources connected in common to a current source;

biasing first and second bipolar transistors in the first transconductance stage in the active region, said first and second bipolar transistors having a collector-emitter path connected in series with source-drain paths of the first and second MOS transistors;

applying the first input differential voltage to gates of the first and second MOS transistors, to vary the currents conducted thereby;

varying the transconductance of second and third transconductance stages by conducting the currents conducted by the first and second MOS transistors from bias nodes of the second and third transconductance stages, respectively;

applying the second differential input voltage to the second and third transconductance stages, wherein the second and third transconductance stages are cross-coupled at first and second output nodes, to generate a differential output current at the first and second output nodes that corresponds to the multiplicative product of the first and second differential input voltages;

maintaining a first source-drain voltage for the first and second MOS transistors by conducting a controlled current through a resistor connected between a first bias node and the sources of the first and second MOS transistor, said first bias node being connected to the bases of the first and second bipolar transistors;

biasing third and fourth MOS transistors in the second transconductance stage in the triode region, said third and fourth MOS transistors having sources connected in common to a current source;

biasing third and fourth bipolar transistors in the second transconductance stage in the active region, said third and fourth bipolar transistors having a collector-emitter path connected in series with source-drain paths of the third and fourth MOS transistors;

setting a second source-drain voltage for the third and fourth MOS transistors by conducting a controlled current through a resistor connected between the bias node of the second transconductance stage and the sources of the third and fourth MOS transistors, wherein the bias node of the second transconductance stage is connected to bases of the third and fourth bipolar transistors;

biasing fifth and sixth MOS transistors in the third transconductance stage in the triode region, said fifth and sixth MOS transistors having sources connected in common to a current source;

biasing fifth and sixth bipolar transistors in the second transconductance stage in the active region, said fifth and sixth bipolar transistors having a collector-emitter path connected in series with source-drain paths of the fifth and sixth MOS transistors:

maintaining a third source-drain voltage for the fifth and sixth MOS transistors by conducting a controlled current through a resistor connected between the bias node of the third transconductance stage and the sources of the fifth and sixth MOS transistors, wherein the bias node of the third transconductance stage is connected to bases of the fifth and sixth bipolar transistors:

applying the second input differential voltage between commonly connected gates of the third and sixth MOS transistors, and commonly connected gates of the fourth and fifth MOS transistors.

8. The method of claim 7, wherein collectors of the third and fifth bipolar transistors are connected in common at a first output node, and wherein collectors of the fourth and sixth bipolar transistors are connected in common at a second output node.

9. The method of claim 8, wherein a first output resistor is connected between the first output node and a power supply voltage, and wherein a second output resistor is connected between the second output node and the power supply voltage.

10. The method of claim 9, further comprising:

developing a differential voltage at the first and second output nodes.

11. A method of multiplying the magnitude of first and second input differential voltages, comprising the steps of:

biasing a first and second differential leg of a first transconductance stage, wherein each leg comprises a bipolar transistor and a MOS transistor connected in series, such that the bipolar transistors in the first and second differential legs are in an active state and the MOS transistors in the first and second differential legs are operating in a triode region;

receiving a first differential input voltage at input gates of the MOS transistors of the first and second differential leg of the first transconductance stage;

biasing a third and fourth differential leg of a second transconductance stage, wherein each leg comprises a bipolar transistor and a MOS transistor connected in series and wherein the second transconductance stage is cross-coupled to the first transconductance stage at first and second output nodes, such that the bipolar transistors in the third and fourth differential legs are in an active state and the MOS transistors in the first and second differential legs are operating in the triode region;

receiving the first differential input voltage at input gates of the MOS transistors of the third and fourth differential leg of the second transconductance stage;

biasing a fifth and sixth differential leg of a third transconductance stage, wherein each leg comprises a bipolar transistor and a MOS transistor connected in series, such that the bipolar transistors in the fifth and sixth differential legs are in an active state and the MOS transistors in the fifth and sixth differential legs are operating in the triode region;

receiving a second differential input voltage at input gates of the MOS transistors of the fifth and sixth differential legs of the third transconductance stage and thereby varying the currents conducted by the MOS transistors of the fifth and sixth differential legs;

varying the transconductance of the MOS transistors of the first and second transconductance stages by conducting the currents conducted by the fifth and sixth differential legs from bias nodes of the first and second transconductance stages, respectively; and generating a differential output current at the first and second output nodes that corresponds to the multiplicative product of the first and second differential input voltages; and wherein the biasing of the first and second differential legs of the first transconductance stage, comprises the step of maintaining a first source-drain voltage for the MOS transistors of the first and second differential legs by conducting a controlled current through a resistor connected between the bias node of the first transconductance stage and the sources of the MOS transistors of the first and second differential legs, said bias node of the first transconductance stage being connected to the bases of the bipolar transistors of the first and second differential legs.

12. The method of claim 11, wherein the biasing of the fifth and sixth differential legs of the third transconductance stage, comprises the step of:

maintaining a third source-drain voltage for the MOS transistors of the fifth and sixth differential legs by conducting a controlled current through a resistor connected between a bias node of the third transconductance stage and the sources of the MOS transistors of the fifth and sixth differential legs, said bias node of the third transconductance stage being connected to the bases of the bipolar transistors of the fifth and sixth differential legs.

13. The method of claim 11, wherein a first output resistor is connected between the first output node and a power supply voltage, and wherein a second output resistor is connected between the second output node and the power supply voltage.

14. A method of multiplying the magnitude of first and second input differential voltages, comprising the steps of:

biasing a first and second differential leg of a first transconductance stage, wherein each leg comprises a bipolar transistor and a MOS transistor connected in series, such that the bipolar transistors in the first and second differential legs are in an active state and the MOS transistors in the first and second differential legs are operating in a triode region;

receiving a first differential input voltage at input gates of the MOS transistors of the first and second differential leg of the first transconductance stage;

biasing a third and fourth differential leg of a second transconductance stage, wherein each leg comprises a bipolar transistor and a MOS transistor connected in series and wherein the second transconductance stage is cross-coupled to the first transconductance stage at first and second output nodes, such that the bipolar transistors in the third and fourth differential legs are in an active state and the MOS transistors in the first and second differential legs are operating in the triode region;

receiving the first differential input voltage at input gates of the MOS transistors of the third and fourth differential leg of the second transconductance stage;

biasing a fifth and sixth differential leg of a third transconductance stage, wherein each leg comprises a bipolar transistor and a MOS transistor connected in series, such that the bipolar transistors in the fifth and sixth differential legs are in an active state and the MOS transistors in the fifth and sixth differential legs are operating in the triode region;

receiving a second differential input voltage at input gates of the MOS transistors of the fifth and sixth differential legs of the third transconductance stage and thereby varying the currents conducted by the MOS transistors of the fifth and sixth differential legs;

varying the transconductance of the MOS transistors of the first and second transconductance stages by conducting the currents conducted by the fifth and sixth differential legs from bias nodes of the first and second transconductance stages, respectively; and generating a differential output current at the first and second output nodes that corresponds to the multiplicative product of the first and second differential input voltages; and wherein the biasing of the third and fourth differential legs of the second transconductance stage, comprises the step of maintaining a second source-drain voltage for the MOS transistors of the third and fourth differential legs by conducting a controlled current through a resistor connected between the bias node of the second transconductance stage and the sources of the MOS transistors of the third and fourth differential legs, said bias node of the second transconductance stage being connected to the bases of the bipolar transistors of the third and fourth differential legs.

* * * * *

UNITED STATES PATENT AND TRADEMARK OFFICE

CERTIFICATE OF CORRECTION

PATENT NO. : 5,587,682

DATED : December 24, 1996

INVENTOR(S) : Gianluca Colli, et. al.

It is certified that error appears in the above-indentified patent and that said Letters Patent is hereby corrected as shown below:

Col. 3, ln. 23, delete ",", insert --.--.

Col. 5, ln. 17, delete "$V_+$,", insert --$V_{b+}$,--.

Col. 7, ln. 16, delete "$I_{0-}$=", insert --$I_{0+}$=--.

Signed and Sealed this

Sixth Day of May, 1997

Attest:

Bruce Lehman

BRUCE LEHMAN

*Attesting Officer*

*Commissioner of Patents and Trademarks*